(12) United States Patent
Choi et al.

(10) Patent No.: US 6,946,791 B2
(45) Date of Patent: Sep. 20, 2005

(54) ORGANIC ELECTROLUMINESCENCE DISPLAY PANEL

(75) Inventors: Beohm-Rock Choi, Seoul (KR); Chong-Chul Chai, Seoul (KR); Kyong-Ju Shin, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 94 days.

(21) Appl. No.: 10/732,280

(22) Filed: Dec. 11, 2003

(65) Prior Publication Data

US 2004/0135173 A1 Jul. 15, 2004

(30) Foreign Application Priority Data

Dec. 11, 2002 (KR) ................................ 10-2002-0078744

(51) Int. Cl.[7] .............................. H01J 1/62; G09G 3/30
(52) U.S. Cl. .......................... 313/506; 313/509; 345/76
(58) Field of Search ................................. 313/505, 506, 313/509, 504, 498; 345/80, 76; 315/169.3

(56) References Cited

U.S. PATENT DOCUMENTS 6,828,726 B2 * 12/2004 Sakurai et al. .............. 313/506
2003/0034497 A1 * 2/2003 Yamazaki et al. ............ 257/86

* cited by examiner

*Primary Examiner*—Tuyet Thi Vo
(74) *Attorney, Agent, or Firm*—McGuireWoods LLP

(57) ABSTRACT

According to an aspect of the present invention, an organic electro-luminescence display panel is provided, which includes: an insulating substrate; a polysilicon layer formed on the substrate; a first insulating layer formed on the polysilicon layer; a gate wire formed on the first insulating layer; a second insulating layer formed on the gate wire; a data wire formed on the second insulating layer and including first and second portions; a pixel electrode connected to the first portion of the data wire; a partition defining an area on the pixel electrode; an organic light emitting member formed in the area on the pixel electrode; a common electrode formed on the light emitting member; and a planar supply voltage electrode disposed between the pixel electrode and the substrate and connected to the second portion of the data wire.

15 Claims, 22 Drawing Sheets

ORGANIC ELECTROLUMINESCENCE DISPLAY PANEL

BACKGROUND OF THE INVENTION (a) Field of the Invention

The present invention relates to an organic electroluminescence display panel.

(b) Description of the Related Art

Generally, an organic electro-luminescence (EL) display is a self emissive display device, which displays images by exciting an emissive organic material to emit light. The organic EL display includes an anode (hole injection electrode), a cathode (electron injection electrode), and an organic light emission layer interposed therebetween. When the holes and the electrons are injected into the light emission layer, they are recombined and pair annihilated with emitting light. The light emission layer further includes an electron transport layer (ETL) and a hole transport layer (HTL) as well as an electron injecting layer (EIL) and a hole injecting layer (HIL) for enhancing the light emission.

A plurality of pixels of the organic EL display, each including an anode, a cathode, and a light emission layer, are arranged in a matrix and driven in passive matrix (or simple matrix) addressing or active matrix addressing.

The passive matrix type organic EL display includes a plurality of anode lines, a plurality of cathode lines intersecting the anode lines, and a plurality of pixels, each including a light emission layer. The selection of one of the anode lines and one of the cathode lines cause light emission of a pixel located at the intersection of the selected signal lines.

The active matrix type organic EL display includes a plurality of pixels, each including a switching transistor, a driving transistor, and a storage capacitor as well as an anode, a cathode, and a light emission layer. The EL display further includes a plurality of gate lines transmitting gate signals and a plurality of data lines transmitting data voltages. The switching transistor is connected to one of the gate lines and one of the data lines and transmits the data voltage from the data line in response to the gate signal. The driving transistor receives the data voltage from the switching transistor and drives a current having a magnitude determined depending on the difference between the data voltage and a predetermined voltage such as a supply voltage. The current from the driving transistor enters the light emission layer to cause light emission having an intensity depending on the current. The storage capacitor is connected between the data voltage and the supply voltage to maintain their voltage difference. The gray scaling of the active matrix type EL display is accomplished by controlling the data voltages to adjust the current driven by the driving transistor. The color representation of the EL display is obtained by providing red, green and blue light emission layers.

In the meantime, the decrease of the supply voltage reduces the current driven by the driving transistors such that the displayed image is darker than is expected. For example, the data voltages with higher magnitude for displaying higher grays experience higher voltage drop such that the reduction of the currents driven by the driving transistors is much severer. The smaller currents makes the pixels associated therewith emit darker lights, thereby generating cross-talk, which becomes severer as the number of the pixels expected to emit bright lights is increased.

SUMMARY OF THE INVENTION

A motivation of the present invention is to solve the above-described problems.

According to an aspect of the present invention, an organic electro-luminescence display panel is provided, which includes: an insulating substrate; a polysilicon layer formed on the substrate; a first insulating layer formed on the polysilicon layer; a gate wire formed on the first insulating layer; a second insulating layer formed on the gate wire; a data wire formed on the second insulating layer and including first and second portions; a pixel electrode connected to the first portion of the data wire; a partition defining an area on the pixel electrode; an organic light emitting member formed in the area on the pixel electrode; a common electrode formed on the light emitting member; and a planar supply voltage electrode disposed between the pixel electrode and the substrate and connected to the second portion of the data wire.

The supply voltage electrode may be disposed directly on the substrate.

The organic electro-luminescence display panel may further include a blocking layer formed on the substrate. The blocking layer may have an opening exposing a portion of the supply voltage electrode, the first and the second insulating layers may have a contact hole exposing the exposed portion of the supply voltage electrode through the opening, and the second portion of the data wire may be connected to the supply voltage electrode through the opening and the contact hole. The opening may be larger than the contact hole.

The polysilicon layer may include first and second transistor portions, each including a channel region, a source region, and a drain region, the gate wire may include first and second gate electrodes overlapping the first and the second transistor portions, respectively, and the data wire may include a first source electrode connected to the source region of the first transistor portion, a first drain electrode connected to the drain region the first transistor portion and the second gate electrode, a second source electrode connected to the source region of the second transistor portion and the supply voltage electrode, and a second drain electrode connected to the drain region of the second transistor portion and the pixel electrode.

The polysilicon layer may further include a storage electrode region connected to the source region of the second transistor portion and the gate wire further comprises a storage electrode overlapping the storage electrode region and connected to the second gate electrode.

The pixel electrode may be formed of the same layer or the same material as the data wire.

The organic electro-luminescence display panel may further include an auxiliary electrode connected between the supply voltage electrode and the second source electrode. The auxiliary electrode may include the same layer as the gate wire.

The partition preferably includes black photoresist.

The pixel electrode may be opaque and the common electrode may be transparent. Alternatively, the pixel electrode is transparent and the common electrode is opaque.

When the pixel electrode is transparent, the supply voltage electrode preferably has a transmitting portion facing the light emitting member for transmitting light from the light emitting member.

The supply voltage electrode preferably has an opening facing at least a portion of the polysilicon layer.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
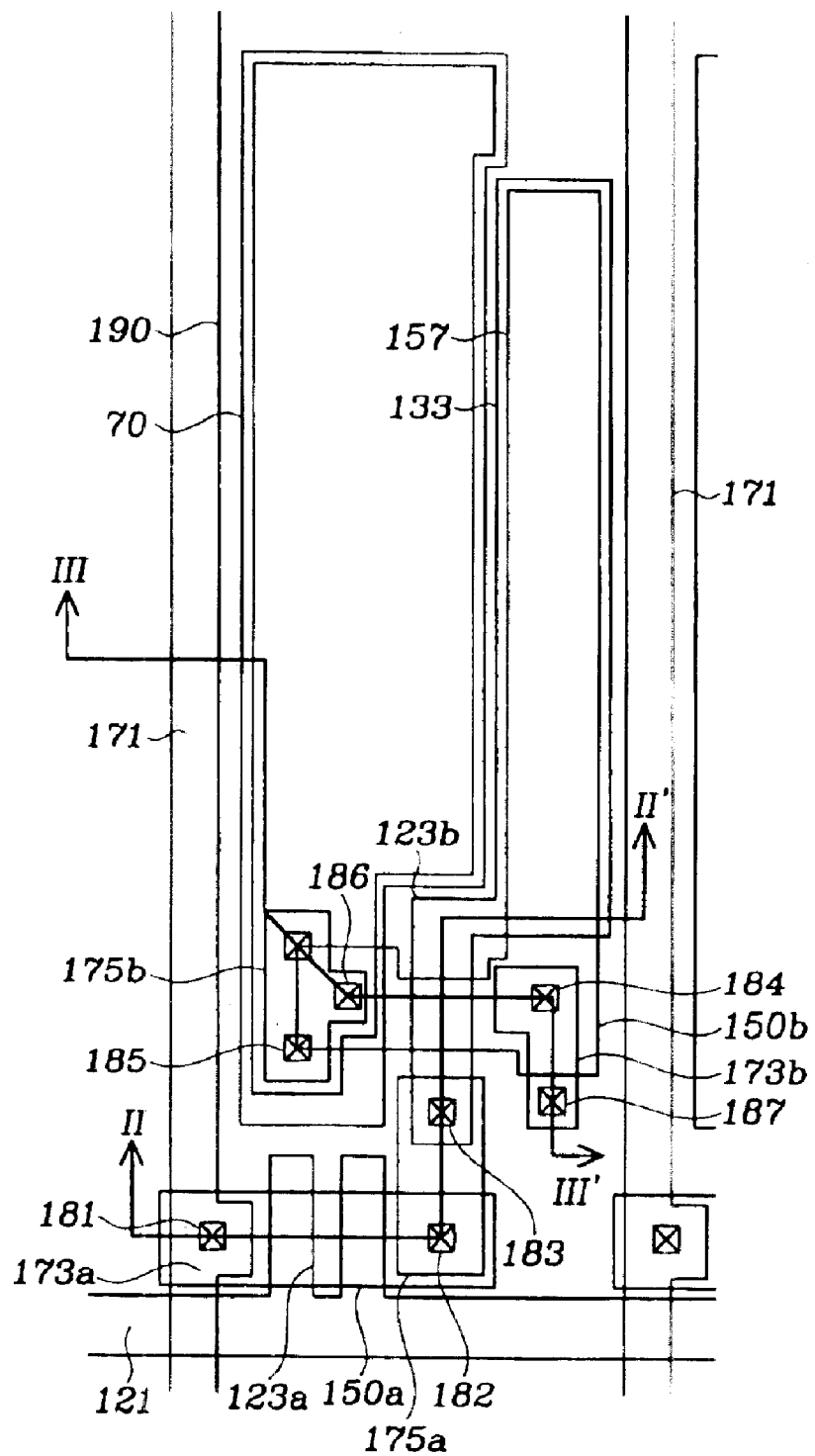
FIG. 1 is a layout view of an organic EL display panel according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate or panel is referred to as being "on" another element, it can be directly on the other element or intervening elements may also be present. In contrast, when an element is referred to as being "directly on" another element, there are no intervening elements present.

Then, organic electroluminescence display devices and manufacturing methods thereof according to embodiments of the present invention will be described with reference to the accompanying drawings.

First, an organic EL display according to an embodiment of the present invention is described in detail with reference to FIGS. 1–3.

Figure 2:
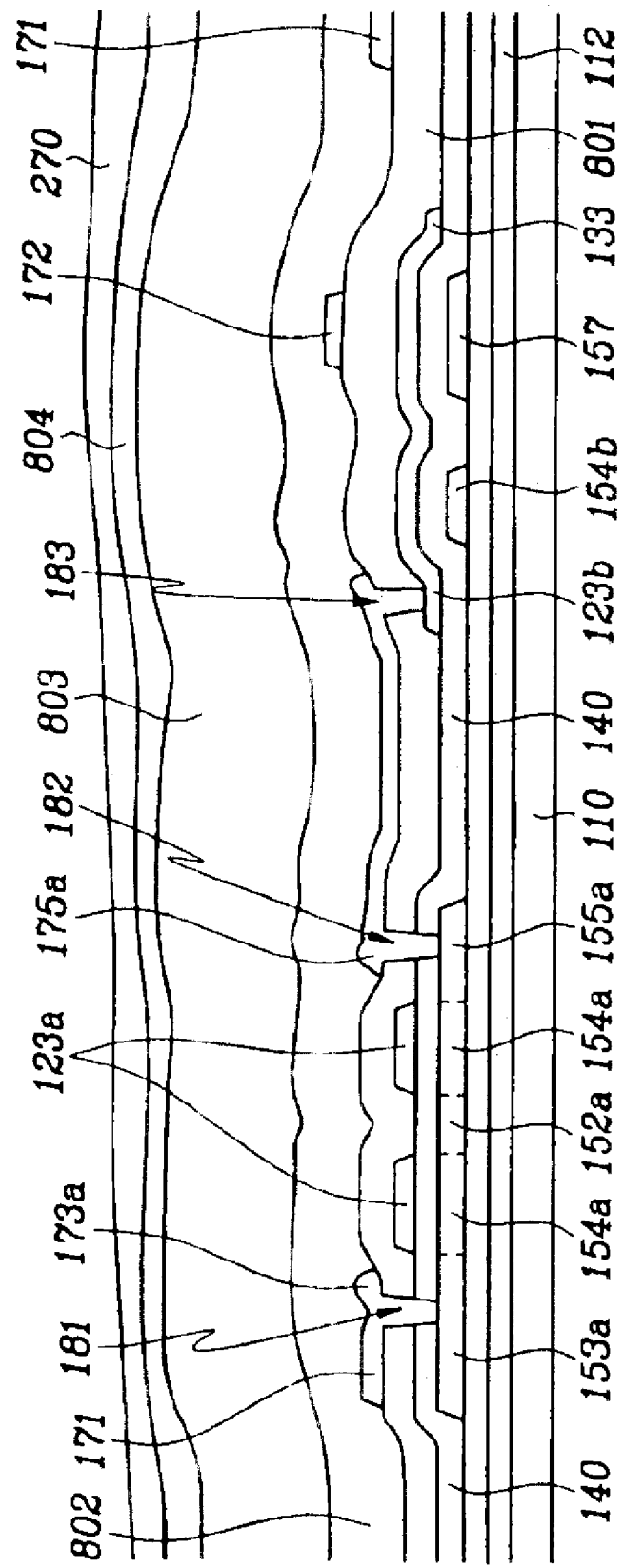
FIG. 2 is a sectional view of the organic EL display panel shown in FIG. 1 taken along the line II–II'.
Figure 3:
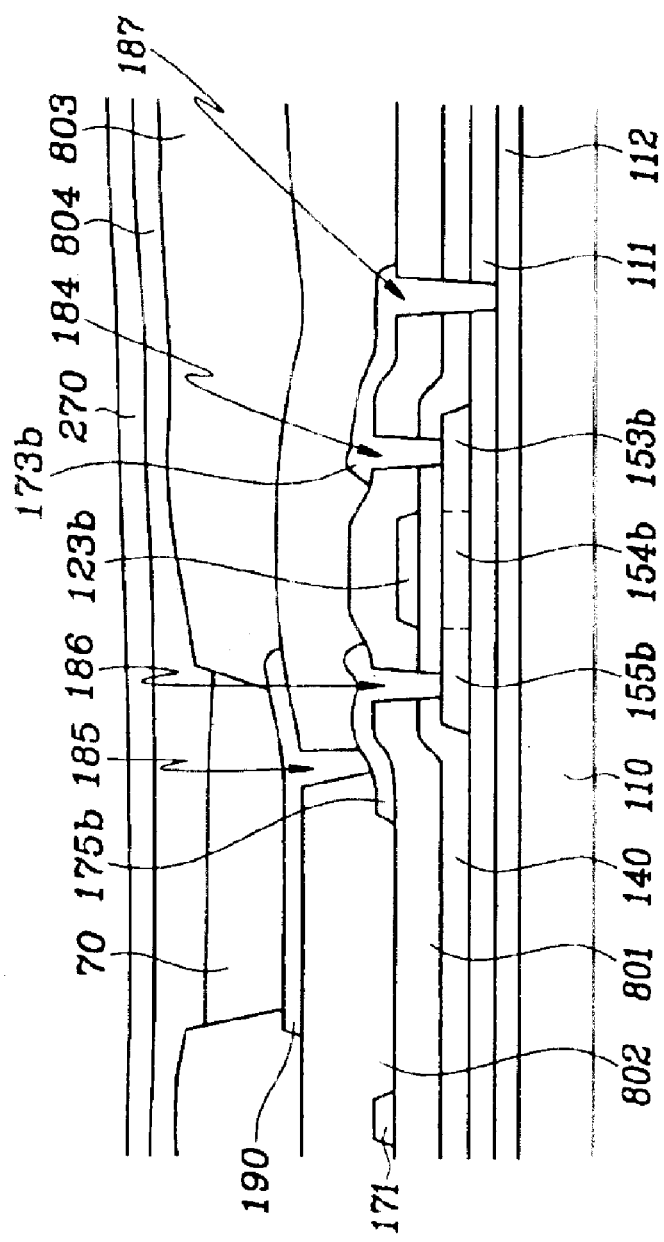
FIG. 3 is a sectional view of the organic EL display panel shown in FIG. 1 taken along the line III–III'.

FIG. 1 is a layout view of an organic EL display panel according to an embodiment of the present invention, FIG. 2 is a sectional view of the organic EL display panel shown in FIG. 1 taken along the line II–II', and FIG. 3 is a sectional view of the organic EL display panel shown in FIG. 1 taken along the line III–III'.

A supply voltage electrode 112 supplied with a predetermined voltage such as a supply voltage is formed on an insulating substrate 110 preferably made of transparent glass or silicon wafer. The supply voltage electrode 112 is preferably made of a conductive material having low resistivity such as Al, Al alloy, Ag, or Ag alloy and it substantially covers an entire surface of the substrate 110 to have a planar shape without having a stripe shape.

A blocking layer 111 preferably made of silicon oxide or silicon nitride is formed on the supply voltage electrode 112.

A polysilicon layer including a plurality of pairs of a first transistor portion 150a for a switching thin film transistor (TFT) and a second transistor portion 150b for a driving TFT is formed on the blocking layer 111.

The first transistor portion 150a includes a plurality of impurity regions such as a (first) source region 153a, an intermediate region 152a, and a (first) drain region 155a, which are doped with n type impurity and separated from one another, and a plurality of intrinsic regions such as a pair of (first) channel regions 154a disposed between the impurity regions 153a, 152a and 155a. The first source region 153a extends to form a storage electrode region 157.

The second transistor portion 150b includes a plurality of impurity regions such as a (second) source region 153b and a (second) drain region 155b, which are doped with p type impurity, and an intrinsic region such as a (second) channel region 154b disposed between the impurity regions 153b and 155b.

Alternatively, the impurity regions 153a, 152a and 155a of the first transistor portion 150a are doped with p type impurity, while the impurity regions 153b and 155b of the second transistor portion 150b are doped with n type impurity, depending on driving conditions.

A gate insulating layer 140 preferably made of silicon oxide or silicon nitride is formed on the polysilicon layer 150a and 150b.

A plurality of gate lines 121 including a plurality of pairs of first gate electrodes 123a and a plurality of second gate electrodes 123b, which are preferably made of low resistivity material such as Al or Al alloy, are formed on the gate insulating layer 140. Each pair of first gate electrodes 123*a* are branched from the gate line 121 and they intersect the first transistor portion 150*a* such that they overlap the pair of the first channel regions 154*a*. Each second gate electrode 123*b* is separated from the gate line 121 and it intersects the second transistor portion 150*b* such that it overlaps the second channel region 154*b*. The second gate electrode 123*b* extends to form a storage electrode 133 overlapping the storage electrode region 157 of the polysilicon layer 150*a* and 150*b* to form a storage capacitor.

A first interlayer insulating film 801 is formed on the gate lines 121 and the first and the second gate electrodes 123*a* and 123*b*.

A plurality of data lines 171, each including a plurality of first source electrodes 173*a*, a plurality of second source electrodes 173*b*, and a plurality of first and second drain electrodes 175*a* and 175*b* are formed on the first interlayer insulating film 801.

Each first source electrode 173*a* is branched from the data line 171 and connected to the first source region 153*a* through a contact hole 181 penetrating the first interlayer insulating film 801 and the gate insulating layer 140. Each first drain electrode 175*a* is connected to the first drain region 155*a* through a contact hole 182 penetrating the first interlayer insulating film 801 and the gate insulating layer 140. The first drain electrode 175*a* is also connected to the second gate electrode 123*b* through a contact hole 183 penetrating the first interlayer insulating film 801 and the gate insulating layer 140.

Each second source electrode 173*b* has an island shape and it is connected to the second source region 153*b* through a contact hole 184 penetrating the first interlayer insulating film 801 and the gate insulating layer 140. Each second drain electrode 175*b* is connected to the second drain region 155*b* through a contact hole 186 penetrating the first interlayer insulating film 801 and the gate insulating layer 140. The second source electrode 173*b* is also connected to the supply voltage electrode 112 through a contact hole 187 penetrating the first interlayer insulating film 801, the gate insulating layer 140, and the blocking layer 111.

A second interlayer insulating film 802 is formed on the data lines 171, the source electrodes 173*a* and 173*b*, and the drain electrodes 175*a* and 175*b*. The second interlayer insulating film 802 is preferably made of silicon nitride, silicon oxide, or organic insulating material and it has a plurality of contact holes 185 exposing the second drain electrodes 175*b*.

A plurality of pixel electrodes 190 are formed on the second interlayer insulating film 802. Each pixel electrode 190 is connected to the second drain electrode 175*b* through the contact hole 185 and it is preferably made of reflective opaque material such as Al or Ag alloy. However, the pixel electrode 190 may be formed of a transparent conductive material such as ITO (indium tin oxide) and IZO (indium zinc oxide). The pixel electrode 190 may be incorporated with the second drain electrode 175*b* for reducing the manufacturing cost.

A partition 803 for separating pixels of the organic EL display panel is formed on the second interlayer insulating film 802 and the pixel electrodes 190. The partition 803 surrounds the pixel electrodes 190 like a bank to define depressions filled with organic light emitting material. The partition 803 is preferably made of organic insulating material and, more preferably, made of a photosensitive material containing black pigment, which is exposed to light and developed, such that the partition 803 functions as a light blocking member and a manufacturing method thereof is simplified.

A plurality of light emitting members 70 are formed on the pixel electrodes 190 and disposed in the depressions defined by the partition 803. The light emitting members 70 are preferably made of organic material emitting primary-color lights such as red, green and blue lights. The red, green and blue light emitting members 70 are arranged periodically.

A buffer layer 804 is formed on the light emitting members 70 and the partition 803. The buffer layer 804 may be omitted if it is not required.

A common electrode 270 supplied with a predetermined voltage is formed on the buffer layer 804. The common electrode 270 is preferably made of transparent conductive material such as ITO and IZO. If the pixel electrodes 190 are transparent, the common electrode 270 is preferably made of reflective opaque metal such as Al.

An auxiliary electrode (not shown) made of low resistivity material is optionally provided for compensating the conductivity of the common electrode 270. The auxiliary electrode may be disposed between the common electrode 270 and the buffer layer 804 or on the common electrode 270, and it preferably has a matrix form and is disposed along the partition 803 such that it does not overlap the light emitting member 70.

In the above-described organic EL display panel, the first transistor portion 150*a*, the first gate electrode 123*a* connected to the gate line 121, the first source electrode 153*a* connected to the data line 171, and the first drain electrode 155*a* form a switching TFT. In addition, the second transistor portion 150*b*, the second gate electrode 123*b* connected to the first drain electrode 155*a*, the second source electrode 153*b* connected to the supply voltage electrode 112, and the second drain electrode 155*b* connected to the pixel electrode 190 form a driving TFT. Furthermore, the pixel electrode 190 and the common electrode 270 serve as an anode and a cathode, respectively, and the storage electrode region 157 connected to the first drain region 155*a* and the storage electrode 133 connected to the supply voltage electrode 112 through the second source electrode 153*b* form a storage capacitor.

The switching TFT transmits the data voltage from the data line 171 to the driving TFT in response to the gate signal from the gate line 121. Upon the receipt of the data voltage, the driving TFT generates a current having a magnitude depending on the difference between the data voltage and the supply voltage. In addition, the data voltage is charged in the storage capacitor to be maintained after the switching TFT is turned off. The current driven by the driving TFT enters into the light emitting member 70 through the pixel electrode 190 and reaches the common electrode 270. The current flowing in the light emitting member 70 means that positive charge carriers such as holes and negative charge carriers such as electrons are injected into the light emitting member 70 from the anode 190 and the cathode 270, respectively, and they are drifted by an electric field generated by the voltage difference between the anode 190 and the cathode 270. The holes and the electrons in the light emitting member 70 then meet each other to be recombined into excitons, which emit light with a predetermined wavelength. The intensity of the emitted light depends on the current driven by the driving TFT and flowing in the light emitting member 70.

The emitted light goes out of the display panel after passing through the common electrode 270 or the pixel electrode 190. A transparent common electrode 270 and an opaque pixel electrode 190 are applicable to a top emission type EL display, which displays an image on its top surface. On the contrary, a transparent pixel electrode 190 and an opaque common electrode 270 are applicable to a bottom emission type EL display, which displays an image on its bottom surface. In the former case, the supply voltage electrode 112 can have various positions or arrangements between the light emitting members 70 and the substrate 111. In the latter case, the supply voltage electrode 112 may be transparent at least in part in order to transmit the light emitted from the light emitting members 70.

As described above, since the supply voltage electrode 112 has a planar shape covering the entire surface of the organic EL display panel, the magnitude of the supply voltage applied to the pixels is almost constant. In addition, since the supply voltage electrode 112 has a sheet resistance, a voltage drop may not significantly differentiate the magnitude of the supply voltage applied to the pixels. Therefore, a cross-talk resulted from the difference in the brightness between the pixels is significantly reduced.

Now, a method of manufacturing the organic EL display panel shown in FIGS. 1–3 is described with reference to FIGS. 4A–10C as well as FIGS. 1–3.

FIGS. 4A, 5A, 6A, 7A, 8A, 9A and 10A are layout views of the organic EL display panel shown in FIGS. 1–3 in intermediate steps of a manufacturing method thereof according to an embodiment of the present invention, FIGS. 4B, 5B, 6B, 7B, 8B, 9B and 10B are sectional views of the organic EL display panels shown in FIGS. 4A, 5A, 6A, 7A, 8A, 9A and 10A taken along the lines IVB–IVB', VB–VB', VIB–VIB', VIIB–VIIB', VIIIB–VIIIB', IXB–IXB', and XB–XB', respectively, and FIGS. 4C, 5C, 6C, 7C, 8C, 9C and 10C are sectional views of the organic EL display panels shown in FIGS. 4A, 5A, 6A, 7A, 8A, 9A and 10A taken along the lines IVC–IVC', VB–VC', VIC–VIC', VIIC–VIIC', VIIIC–VIIIC', IXC–IXC', and XC–XC', respectively.

Figure 4A:
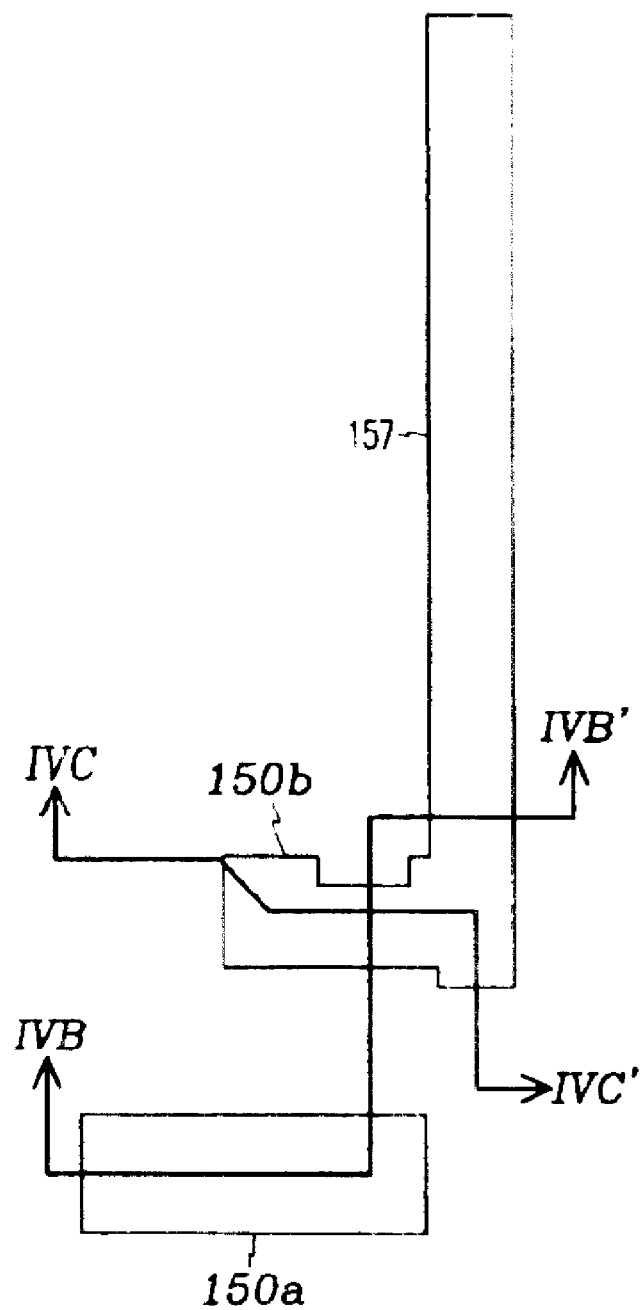
FIG. 4A is a layout view of the organic EL display panel shown in FIGS. 1–3 in a first step of a manufacturing method thereof according to an embodiment of the present invention.
Figure 4B:
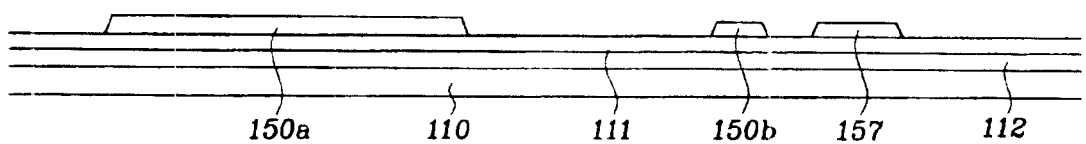
FIGS. 4B and 4C are sectional views of the organic EL display panel shown in FIG. 4A taken along the lines IVB–IVB' and IVC–IVC', respectively.
Figure 4C:
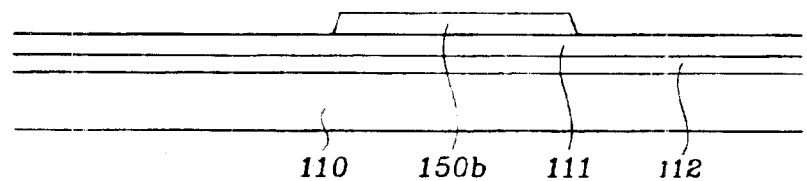

Referring to FIGS. 4A–4C, a conductive material is deposited on an insulating substrate 110 to form a supply voltage electrode 112. The supply voltage electrode 112 may be photo-etched to form openings or transmitting portions therein.

A blocking layer 111 preferably made of silicon oxide is formed on an insulating substrate 110, and an amorphous silicon layer is deposited on the blocking layer 111. The deposition of the amorphous silicon layer is preferably performed by LPCVD (low temperature chemical vapor deposition), PECVD (plasma enhanced chemical vapor deposition) or sputtering. Consecutively, the amorphous silicon layer is laser-annealed to be crystallized into a polysilicon layer.

Next, the polysilicon layer is photo-etched to form a plurality of pairs of first and second transistor portions 150a and 150b.

Figure 5A:
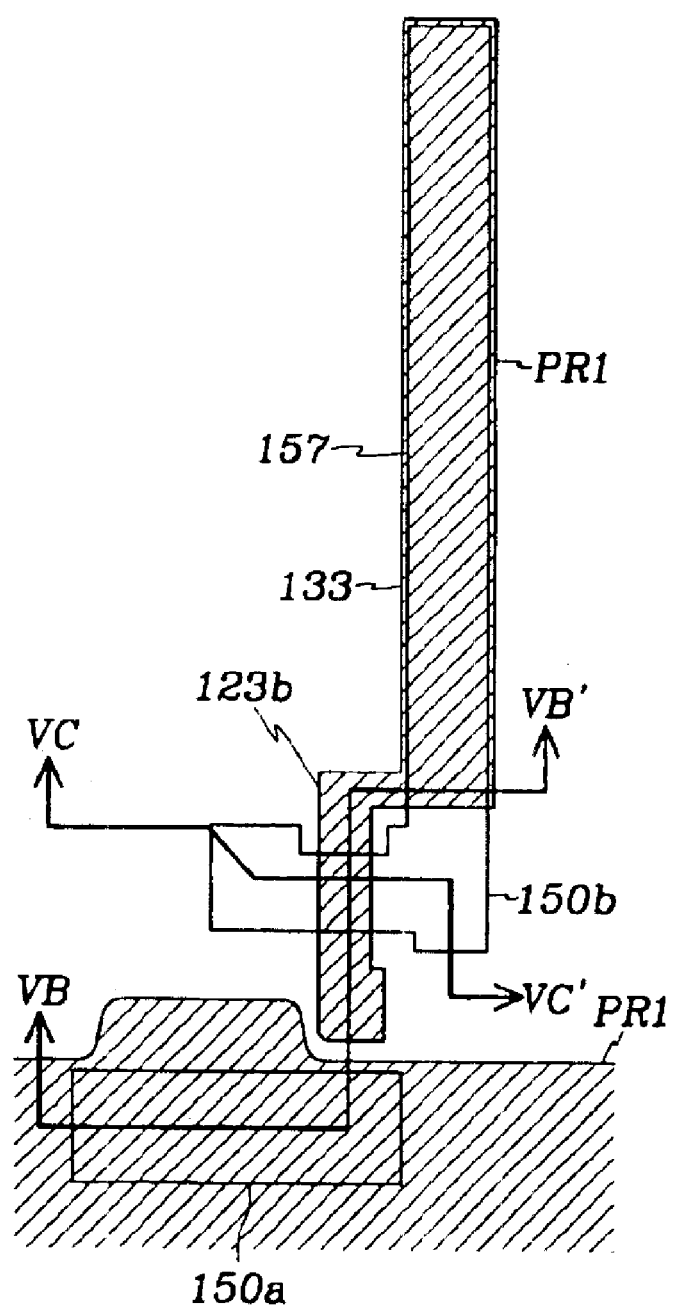
FIG. 5A is a layout view of the organic EL display panel shown in FIGS. 1–3 in a step following the step shown in FIGS. 4A–4C.
Figure 5B:
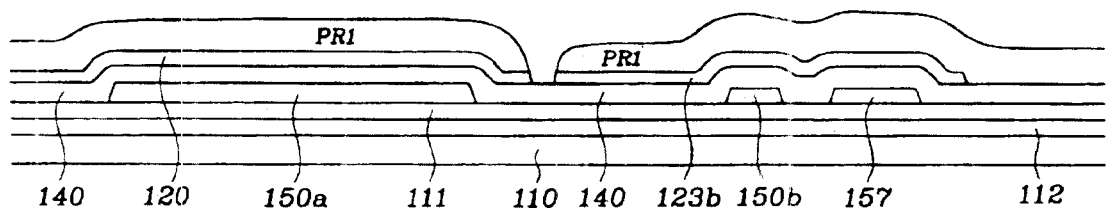
FIGS. 5B and 5C sectional views of the organic EL display panel shown in FIG. 5A taken along the lines VB–VB' and VC–VC', respectively.
Figure 5C:
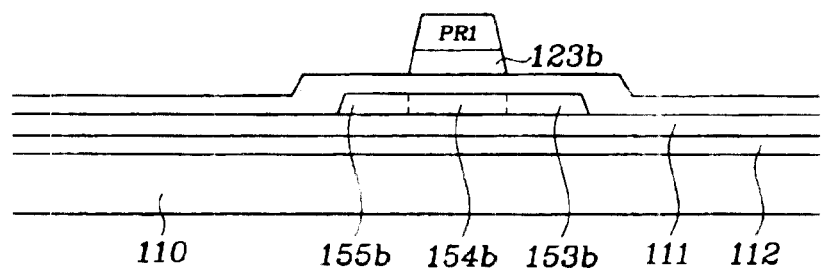

Referring to FIGS. 5A–5C, a gate insulating layer 140 is deposited on the polysilicon layer 150a and 150b.

Successively, a gate metal layer is deposited on the gate insulating layer 140 and a photoresist film is coated, exposed to light, and developed to form a first photoresist PR1. The gate metal layer is etched by using the first photoresist PR1 as an etch mask to form a plurality of gate electrodes 123b including storage electrodes 133 and a plurality of gate metal members 120. P type impurity is injected into exposed portions of the second transistor portions 150b of the polysilicon layer to form a plurality of P type impurity regions 153b and 155b. At this time, the first transistor portions 150a of the polysilicon layer are covered with the first photoresist PR1 and the gate metal members 120 to be protected from impurity implantation.

Figure 6A:
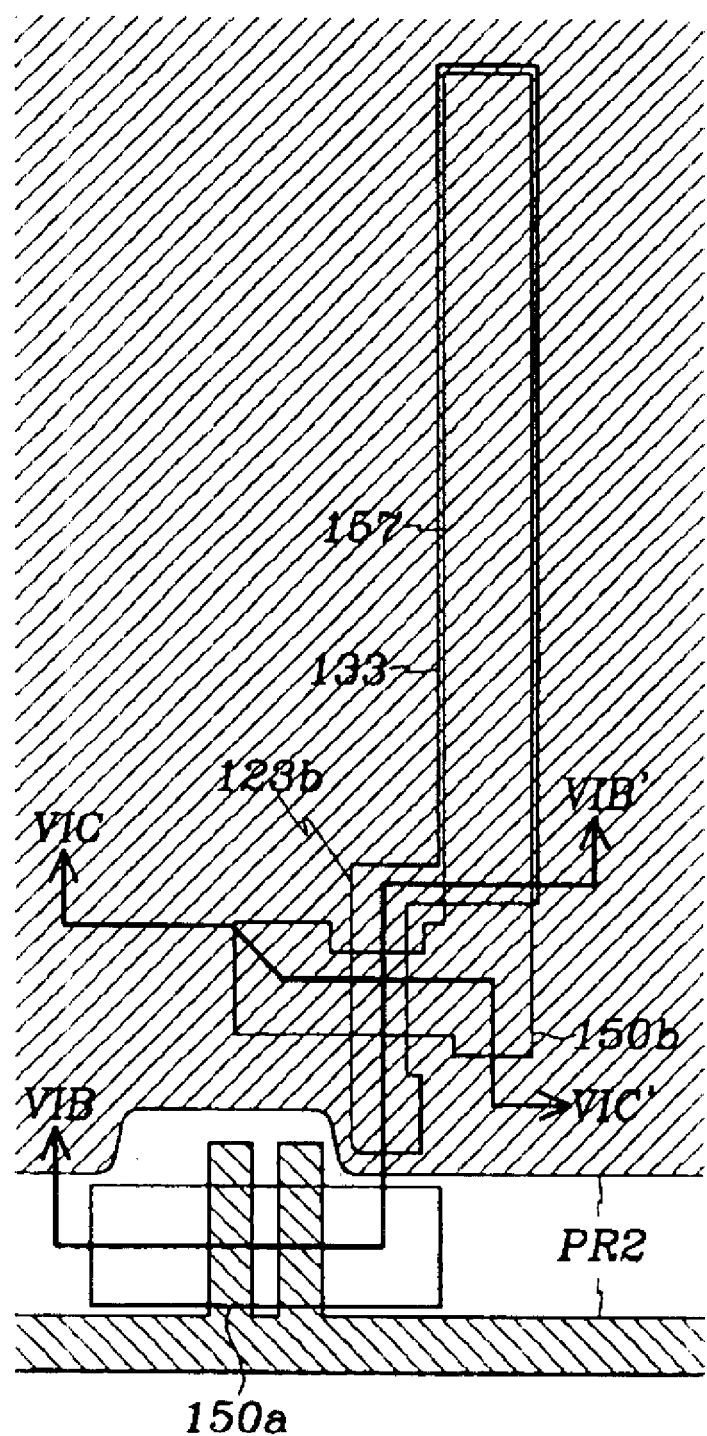
FIG. 6A is a layout view of the organic EL display panel shown in FIGS. 1–3 in a step following the step shown in FIGS. 5A–5C.
Figure 6B:
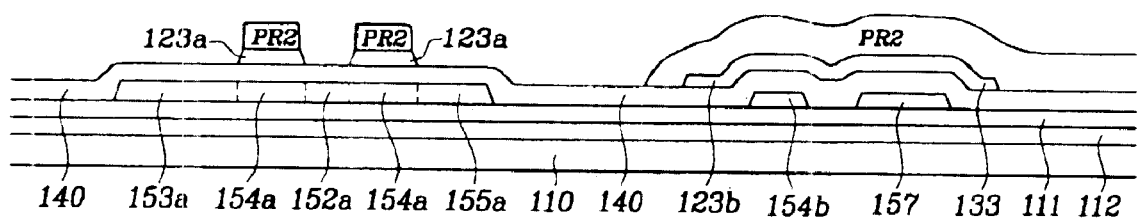
FIGS. 6B and 6C are sectional views of the organic EL display panel shown in FIG. 6A taken along the lines VIB–VIB' and VIC–VIC', respectively.
Figure 6C:
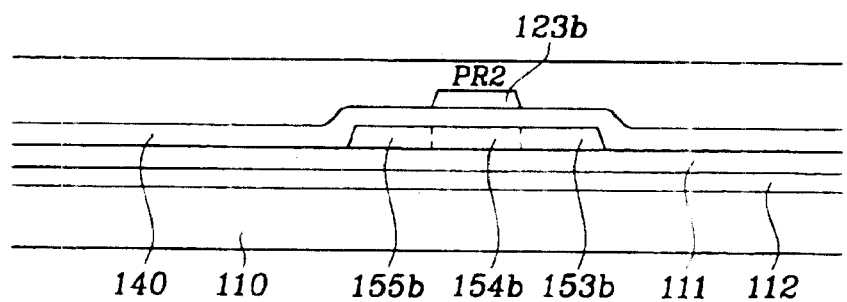

Referring to FIGS. 6A–6C, the first photoresist PR1 is removed and another photoresist film is coated, exposed to light, and developed to form a second photoresist PR2. The gate metal layer 120 is etched by using the first photoresist PR2 as an etch mask to form a plurality of gate lines 121 including gate electrodes 123a. N type impurity is injected into exposed portions of the first transistor portions 150a of the polysilicon layer to form a plurality of N type impurity regions 153a and 155a. At this time, the second transistor portions 150b of the polysilicon layer are covered with the second photoresist PR2 to be protected from impurity implantation.

Figure 7A:
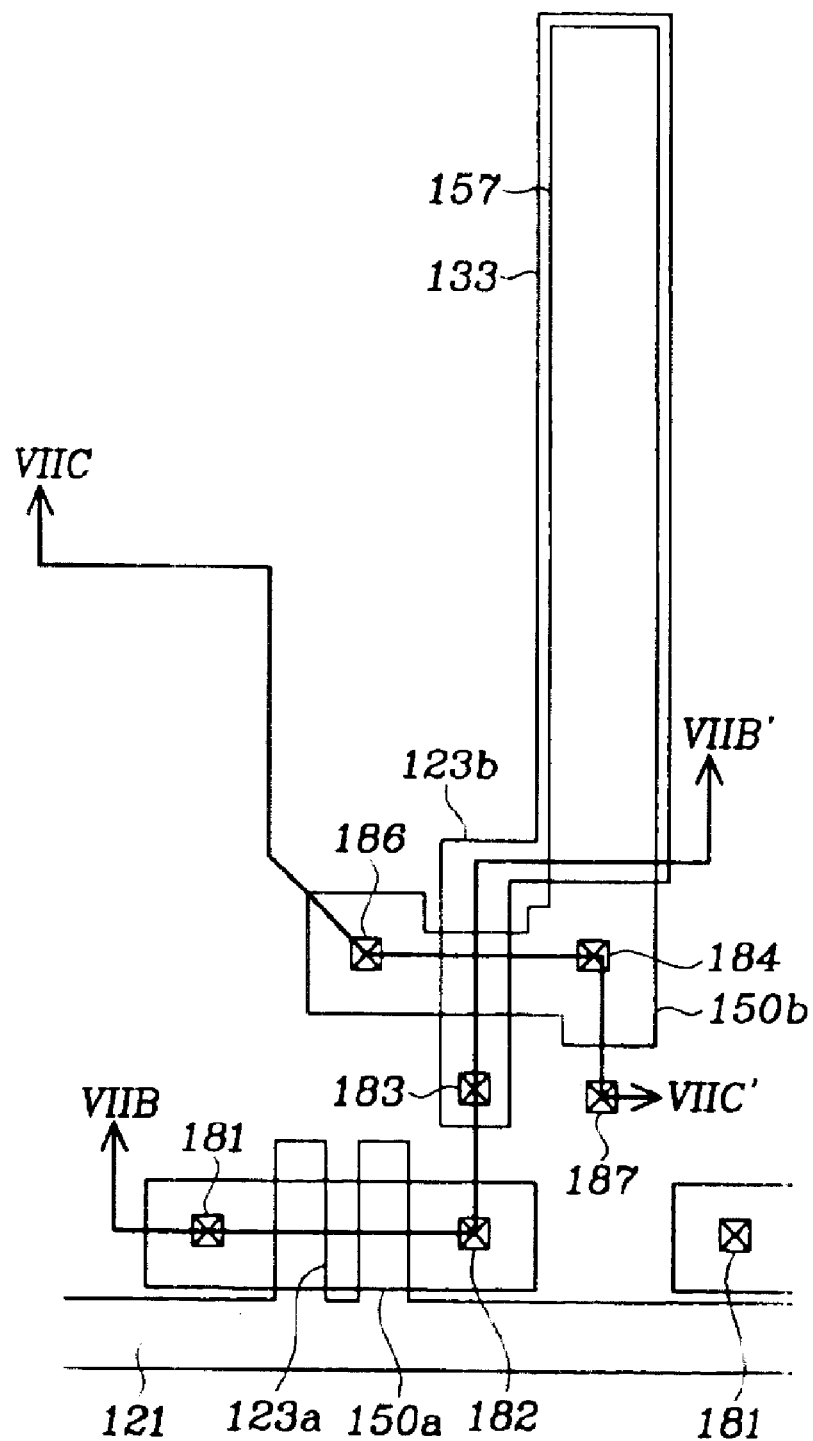
FIG. 7A is a layout view of the organic EL display panel shown in FIGS. 1–3 in a step following the step shown in FIGS. 6A–6C.
Figure 7B:
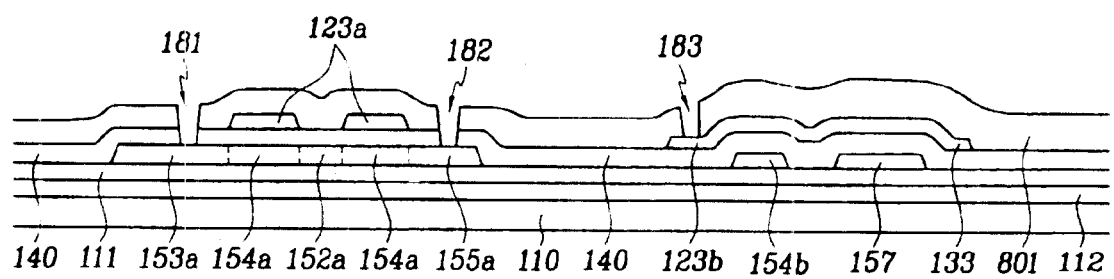
FIGS. 7B and 7C are sectional views of the organic EL display panel shown in FIG. 7A taken along the lines VIIB–VIIB' and VIIC–VIIC', respectively.
Figure 7C:
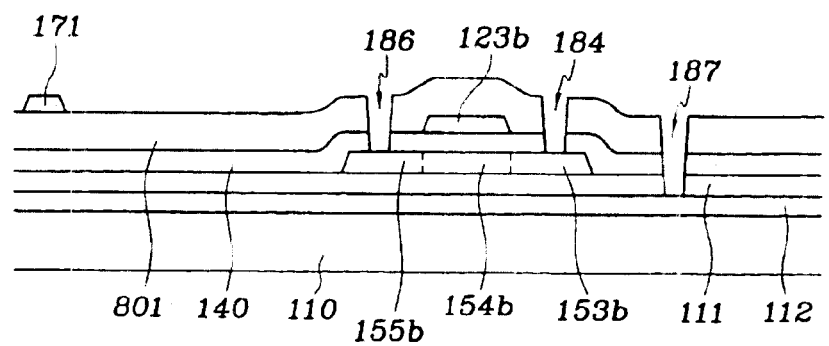

Referring to FIGS. 7A–7C, a first interlayer insulating film 801 is deposited on the gate lines 121 and the gate electrodes 123a and 123b. The first interlayer insulating film 801, the gate insulating layer 140, and the blocking layer 111 are photo-etched form a plurality of contact holes 181, 182, 184 and 186 exposing the impurity regions 153a, 155a, 153b and 155b, respectively, as well as a plurality of contact holes 183 and 187 exposing the gate electrodes 123b and portions of the supply voltage electrode 112.

Figure 8A:
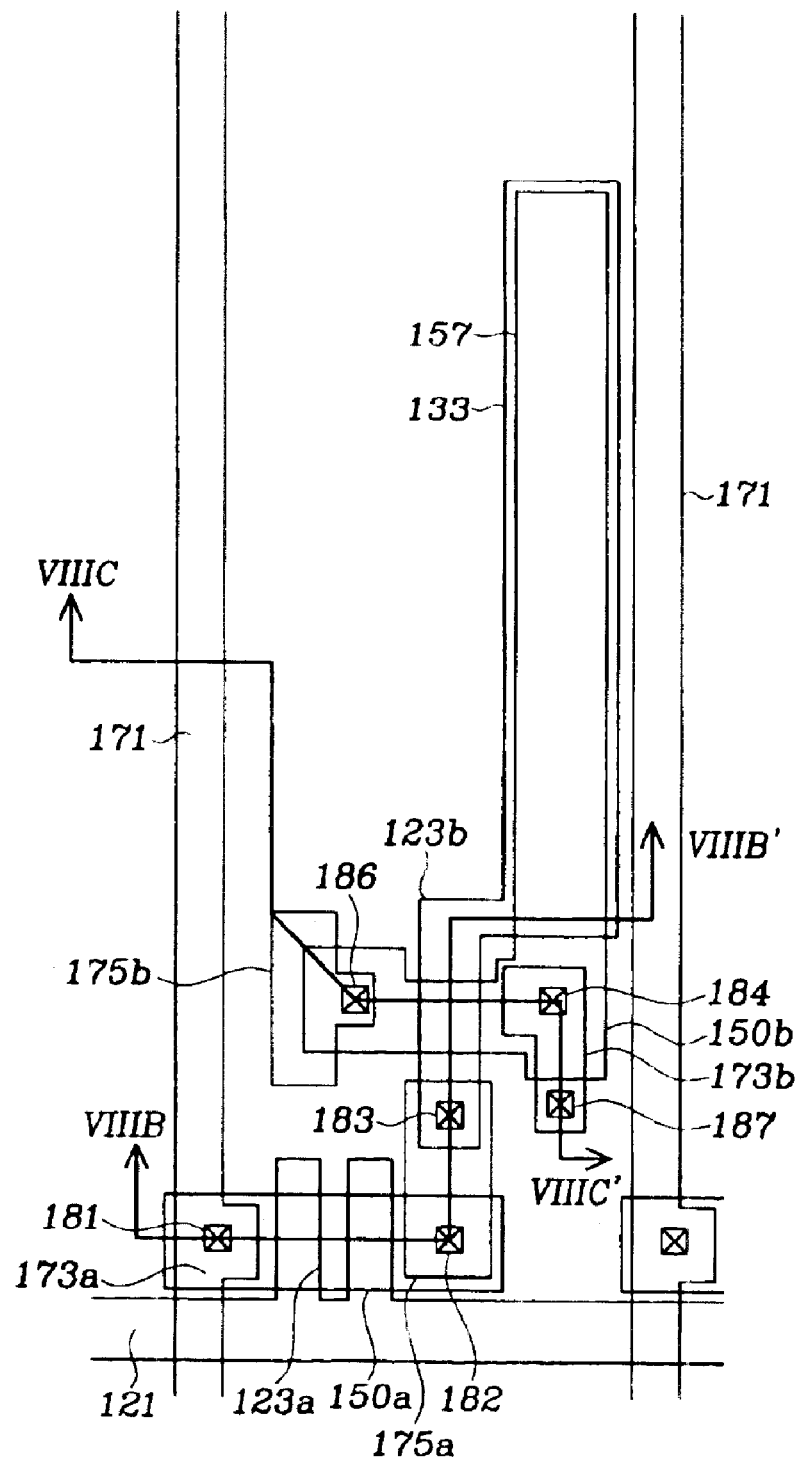
FIG. 8A is a layout view of the organic EL display panel shown in FIGS. 1–3 in a step following the step shown in FIGS. 7A–7C.
Figure 8B:
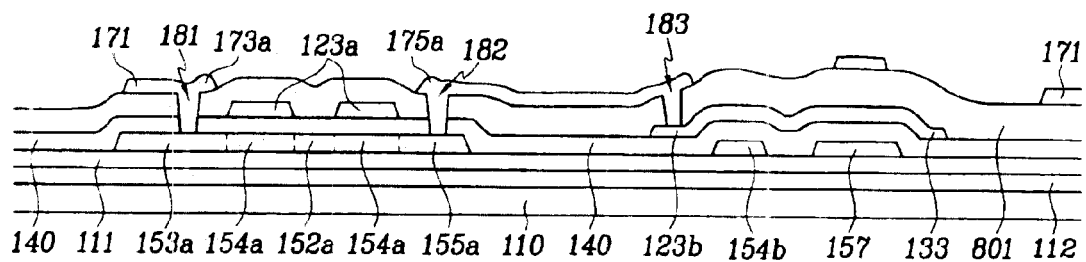
FIGS. 8B and 8C sectional views of the organic EL display panel shown in FIG. 8A taken along the lines VIIIB–VIIIB' and VIIIC–VIIIC', respectively.
Figure 8C:
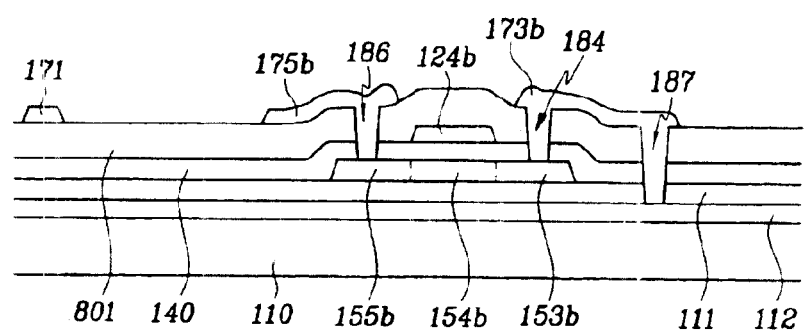

Referring to FIGS. 8A–8C, a data metal layer is deposited and photo-etched to form a plurality of data lines 171 including first source electrodes 173a, a plurality of second source electrodes 173b, a plurality of first and second drain electrodes 175a and 175b.

Figure 9A:
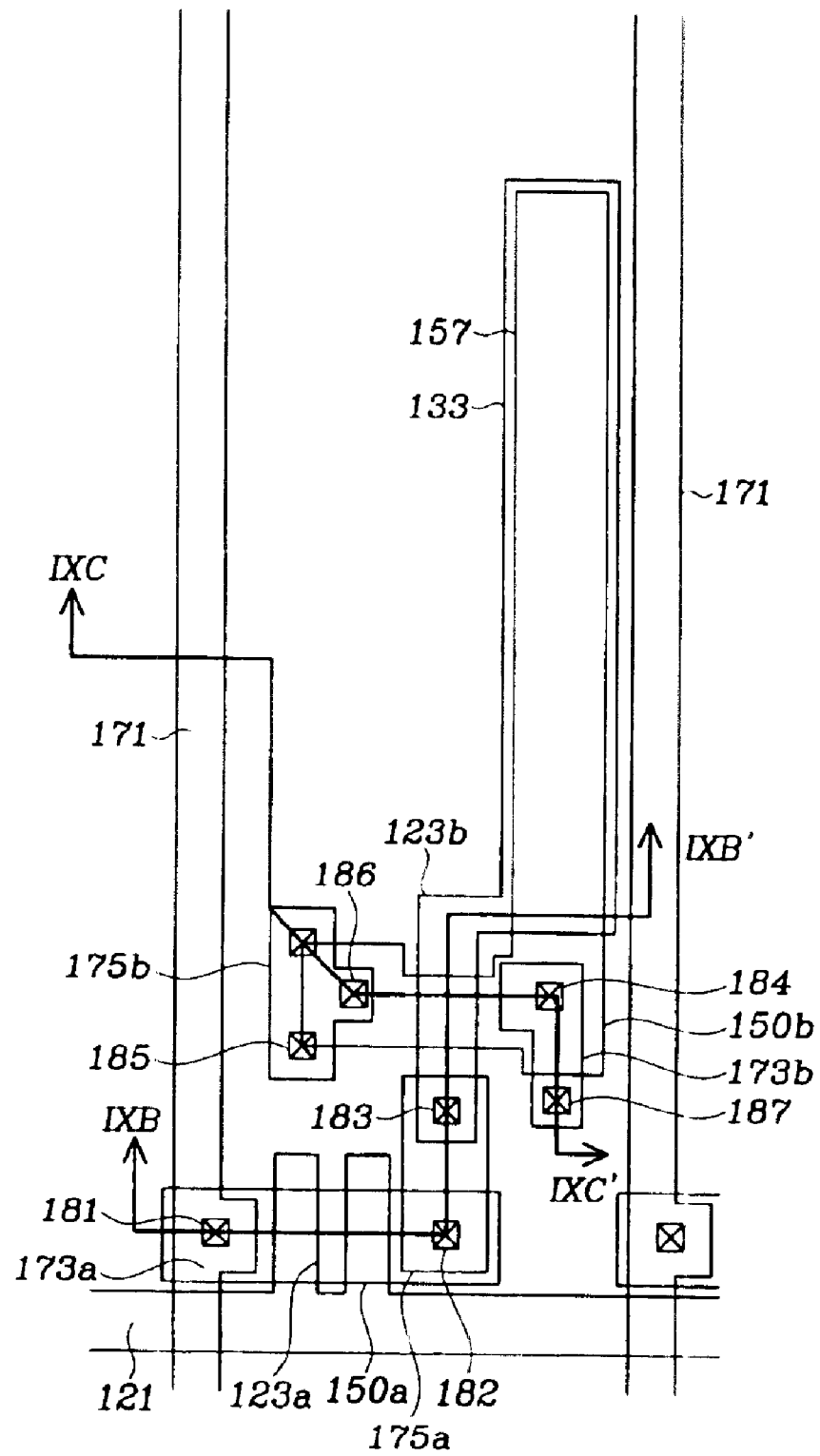
FIG. 9A is a layout view of the organic EL display panel shown in FIGS. 1–3 in a step following the step shown in FIGS. 8A–8C.
Figure 9B:
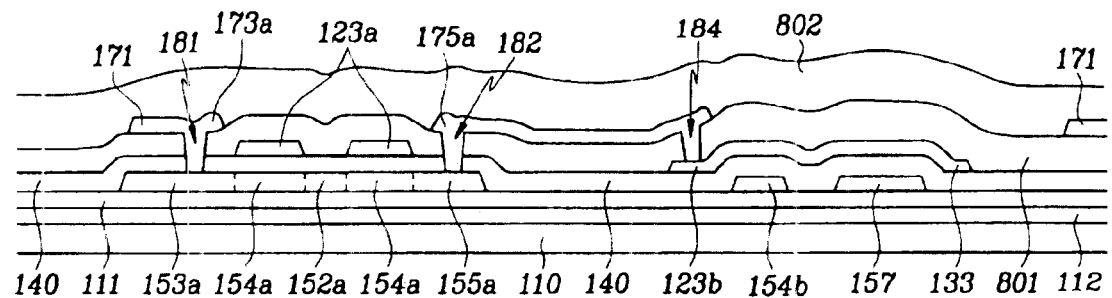
FIGS. 9B and 9C are sectional views of the organic EL display panel shown in FIG. 9A taken along the lines IXB–IXB' and IXC–IXC', respectively.
Figure 9C:
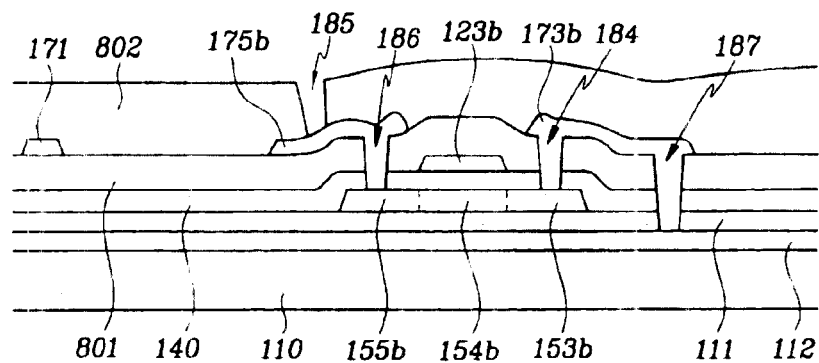

Referring to FIGS. 9A–9C, a second interlayer insulating film 802 is deposited on the data lines 171, the source electrodes 173a and 173b, and the drain electrodes 175a and 175b as well as on the first interlayer insulating film 801. The second interlayer insulating film 802 is photo-etched to form a plurality of contact holes 185 exposing the second drain electrodes 175b.

Figure 10A:
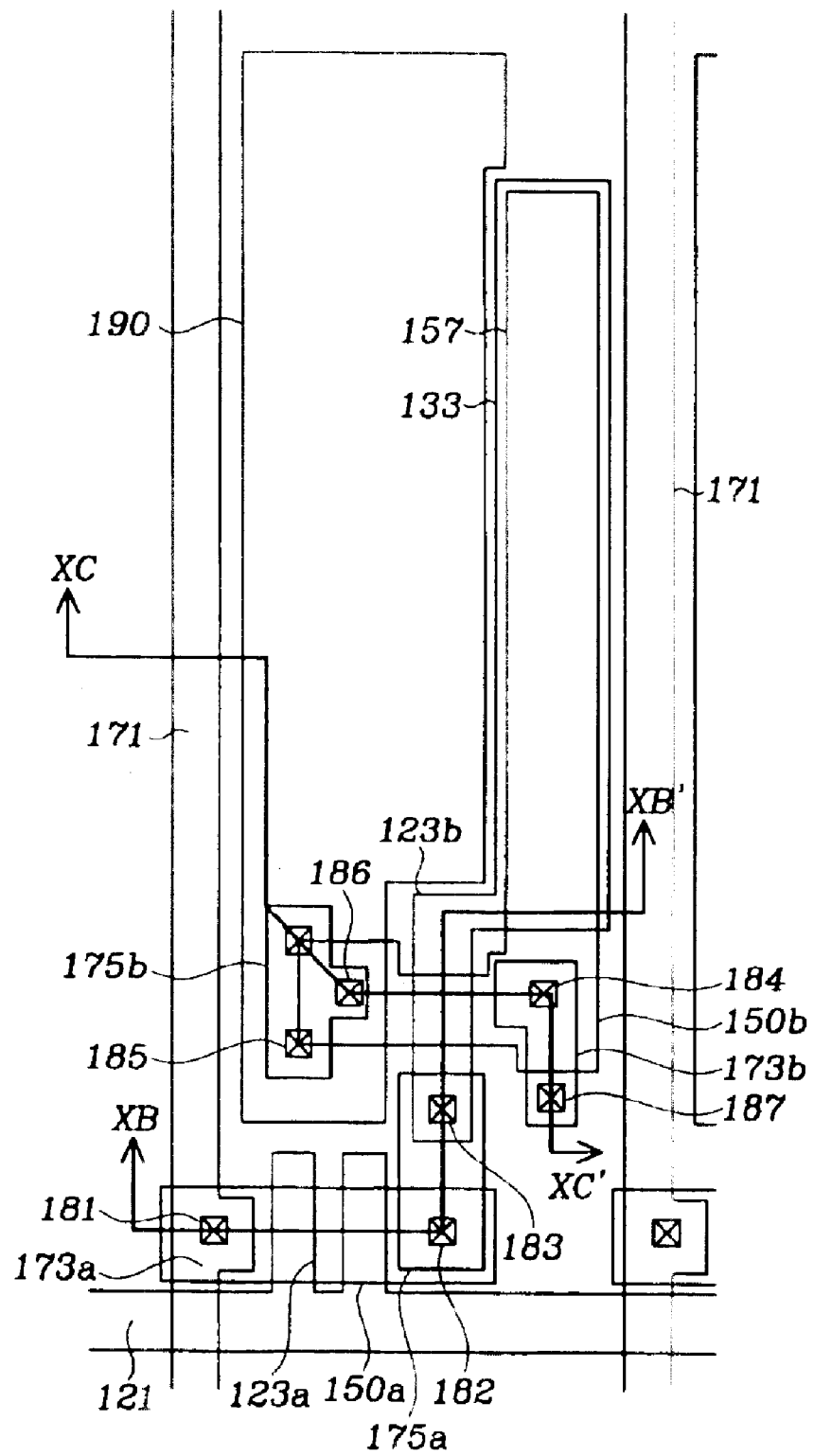
FIG. 10A is a layout view of the organic EL display panel shown in FIGS. 1–3 in a step following the step shown in FIGS. 9A–9C.
Figure 10B:
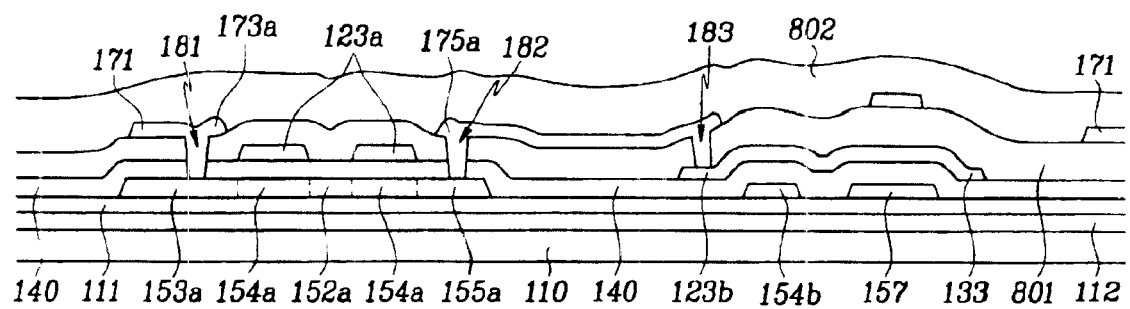
FIGS. 10B and 10C are sectional views of the organic EL display panel shown in FIG. 10A taken along the lines XB–XB' and XC–XC', respectively.
Figure 10C:
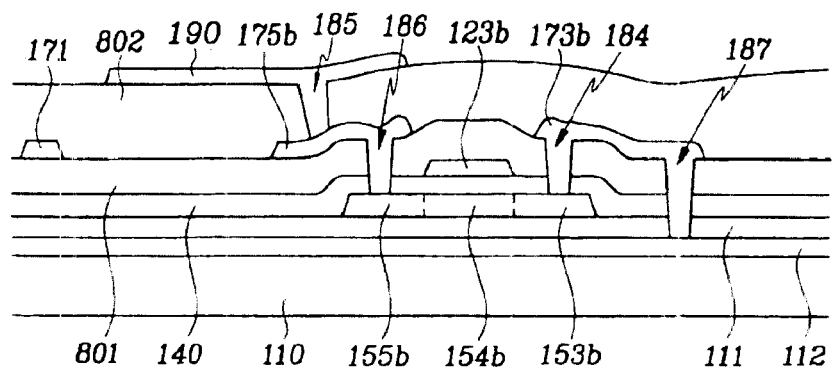

Referring to FIGS. 10A–10C, a transparent conductive material or a low resistivity reflective material is deposited and patterned to form a plurality of pixel electrodes 190. When the pixel electrodes 190 are made of reflective opaque material, they may be formed of the data metal layer along with the data lines 171.

Referring to FIGS. 1–3, an organic film containing black pigment is coated on the pixel electrodes 190 and the second interlayer insulating film 802, and it is exposed to light and developed to form a partition 803 defining a plurality of depressions on the pixel electrodes 190. Thereafter, a plurality of organic light emitting members 70 are formed in the depressions by deposition or inkjet printing following a masking. The organic light emitting member 70 preferably has a multi-layered structure.

Next, an organic conductive material is deposited on the light emitting members 70 to form a buffer layer 804, and ITO or IZO is deposited on the buffer layer 804 to form a common electrode 270.

An auxiliary electrode (not shown) made of low resistivity material such as Al may be formed before or after the formation of the common electrode 270.

As described above, a top emission type organic EL display panel according to this embodiment includes an opaque pixel electrode and a transparent common electrode 270, and it displays an image on its top surface. The supply voltage electrode 112 can be placed on another position under the organic light emitting member 70.

Next, a bottom emission type organic EL display panel including a transparent pixel electrode and an opaque common electrode for displaying an image on its bottom surface is described in detail with reference to FIGS. 11–15.

Figure 11:
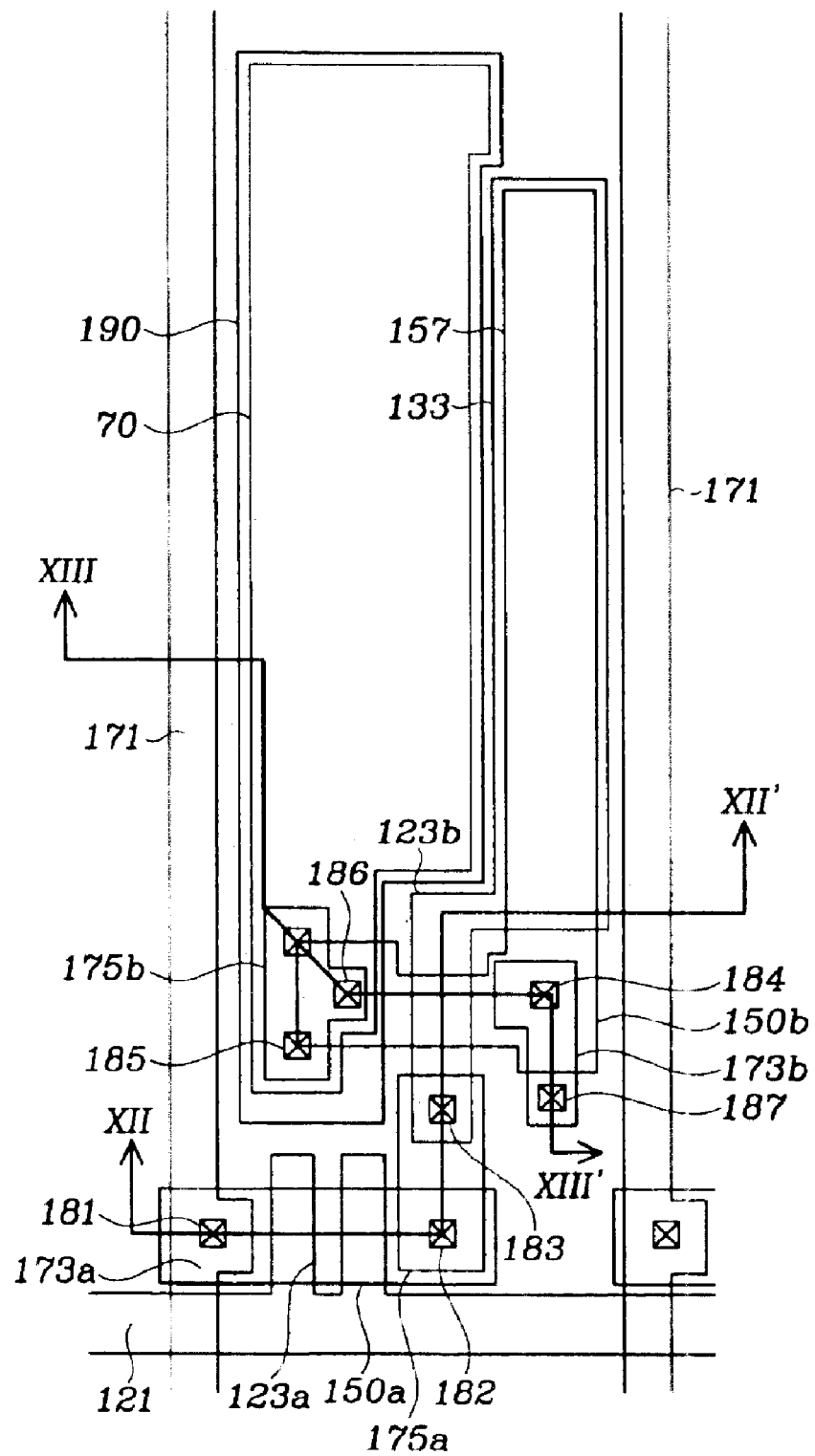
FIG. 11 is a layout view of a bottom emission type organic EL display panel according to an embodiment of the present invention.
Figure 12:
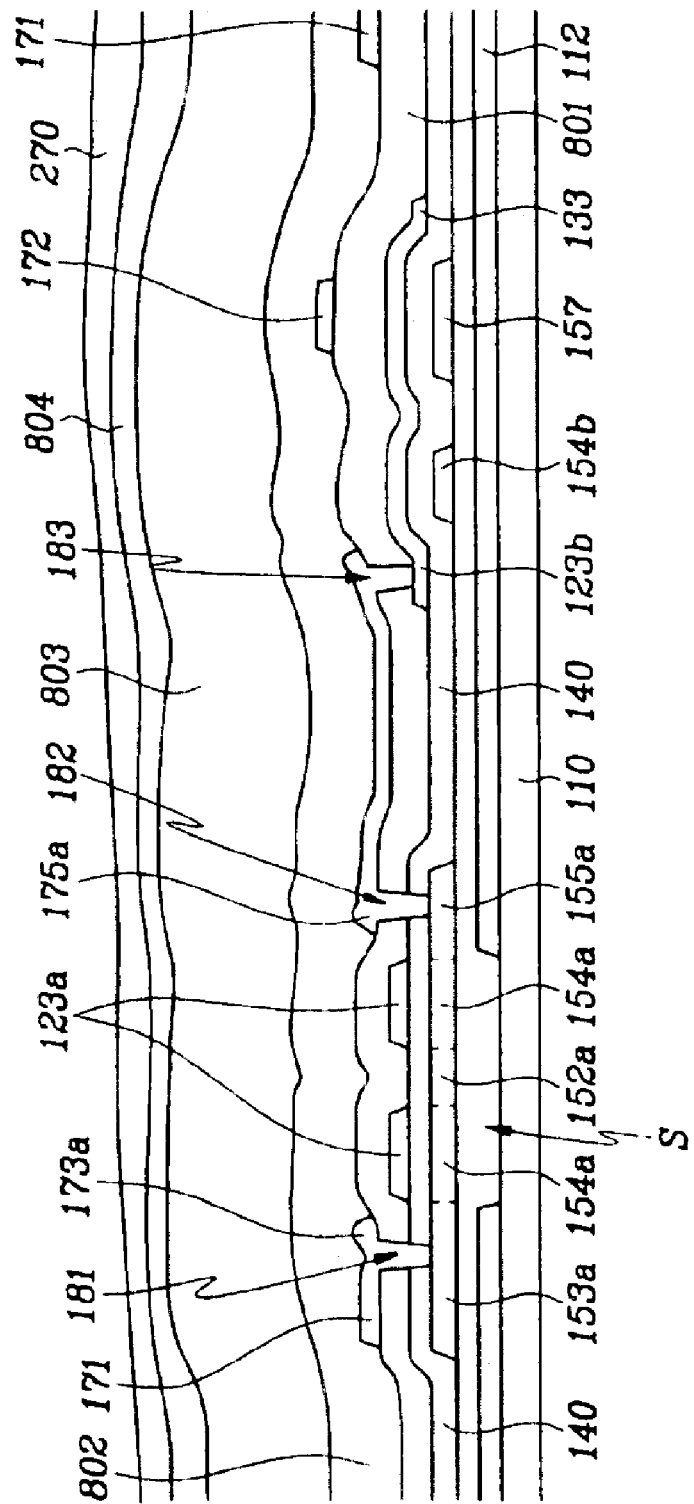
FIG. 12 is an exemplary sectional view of the display panel shown in FIG. 11 taken along the line XII–XII'.
Figure 13:
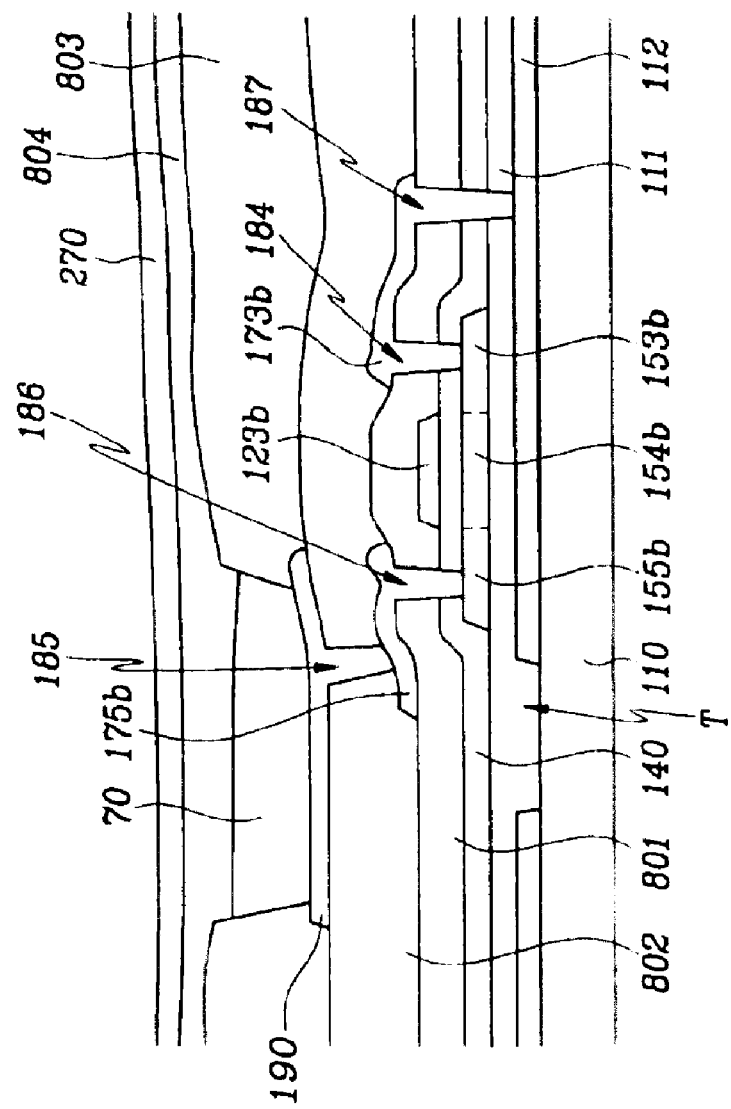
FIG. 13 is an exemplary sectional view of the display panel shown in FIG. 11 taken along the line XIII–XIII'.

FIG. 11 is a layout view of a bottom emission type organic EL display panel according to an embodiment of the present invention and FIGS. 12 and 13 are exemplary sectional views of the display panel shown in FIG. 11 taken along the lines XII–XII' and XIII–XIII', respectively.

As shown in FIGS. 11–13, a structure of an organic EL display panel according to this embodiment is similar to that shown in FIGS. 1–3.

In detail, a supply voltage electrode 112 and a blocking layer 111 are sequentially formed on an insulating substrate 110. A polysilicon layer including a plurality of pairs of a first transistor portion 150a for a switching TFT and a second transistor portion 150b for a driving TFT is formed on the blocking layer 111, and a gate insulating layer 140 is formed thereon. The first transistor portion 150a includes a plurality of impurity regions such as a first source region 153a, an intermediate region 152a, and a first drain region 155a, and a pair of first channel regions 154a disposed between the impurity regions 153a, 152a and 155a. The second portion 150b includes a second source region 153b, a second drain region 155b, and a second channel region 154a disposed between the second source region 153b and the second drain region 155a. A plurality of gate lines 121 including first gate electrodes 123a and a plurality of second gate electrodes 123b including storage electrodes 133 are formed on the gate insulating layer 140, and a first interlayer insulating film 801 is formed thereon. A plurality of data lines 171 including first source electrodes 173a, a plurality of second source electrodes 173b, and a plurality of first and second drain electrodes 175a and 175b are formed on the first interlayer insulating film 801, and a second interlayer insulating film 802 is formed thereon. A plurality of pixel electrode 190 and a partition 803 defining a plurality of depressions on the pixel electrodes 190 are formed on the second interlayer insulating film 802, and a plurality of organic light emitting member 70 are formed in the depressions on the pixel electrodes 190. A buffer layer 804 is formed on the organic light emitting members 70 and the partition 803, and a common electrode 270 is formed on the buffer layer 804.

The pixel electrodes 190 are transparent while the common electrode 270 is opaque. The supply voltage electrode 112 has a plurality of transmitting portions T facing the pixel electrodes 190 for the transmission of light emitted from the light emitting members 70. In addition, the supply voltage electrode 112 has a plurality of openings S facing the channel regions 154a of the first transistor portions 150a for minimizing the effect of a supply voltage on the switching TFTs.

A manufacturing method of the organic EL display panel shown in FIGS. 11–13 according to an embodiment of the present invention forms the openings S and the transmitting portions T by patterning the supply voltage electrode 112 using a photolithography process after depositing the supply voltage electrode 112.

The area of the transmitting portions T of the planar supply voltage electrode 112 according to this embodiment can be increased compared with a conventional linear supply voltage electrode.

Figure 14:
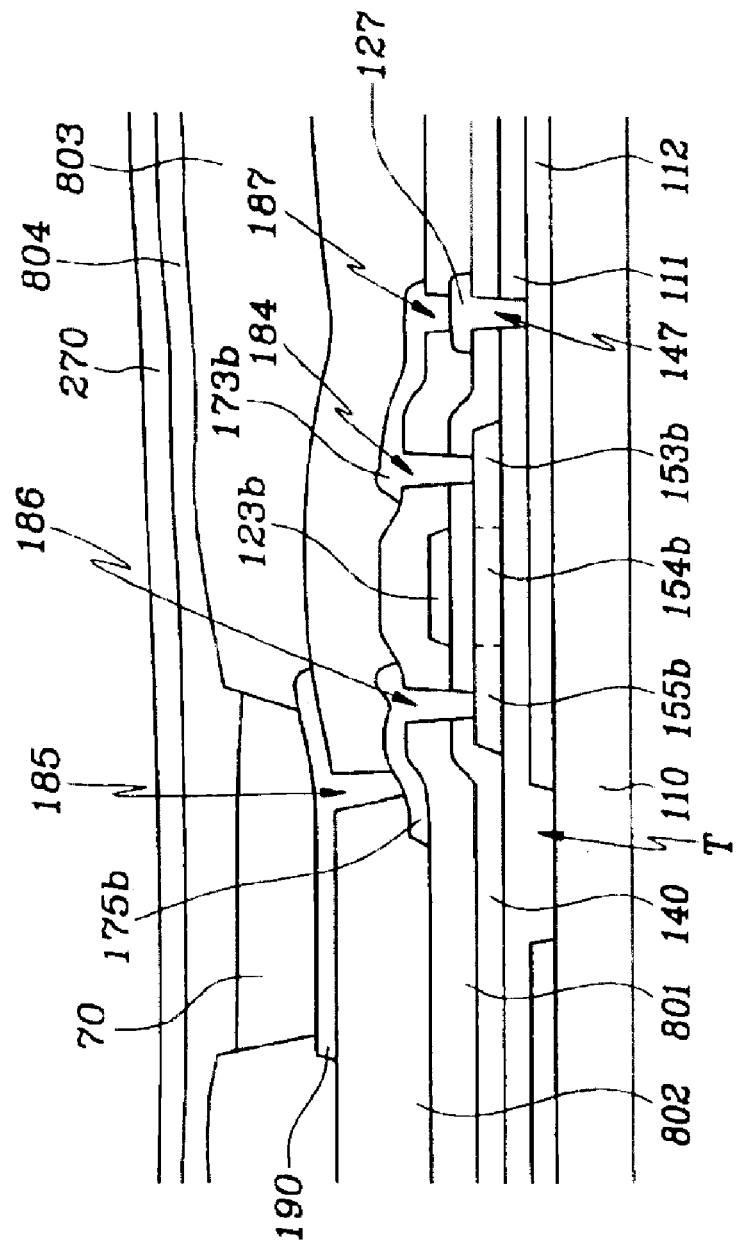
FIG. 14 is another exemplary sectional view of the display panel shown in FIG. 11 taken along the line XIII–XIII'.

FIG. 14 is another exemplary sectional view of the display panel shown in FIG. 11 taken along the lines XIII–XIII'.

Referring to FIG. 14, a plurality of auxiliary members 127 for compensating the connection between the supply voltage electrode 112 and the second source electrodes 173b are formed on the gate insulating layer 140. The auxiliary members 127 are connected to the supply voltage electrode 112 through contact holes 147 penetrating the gate insulating layer 140 and the blocking layer 111, and also connected to the second source electrodes 173b through contact holes 187 penetrating the first interlayer insulating film 801. The auxiliary members 127 are preferably made of the same layer as the gate lines 121.

Figure 15:
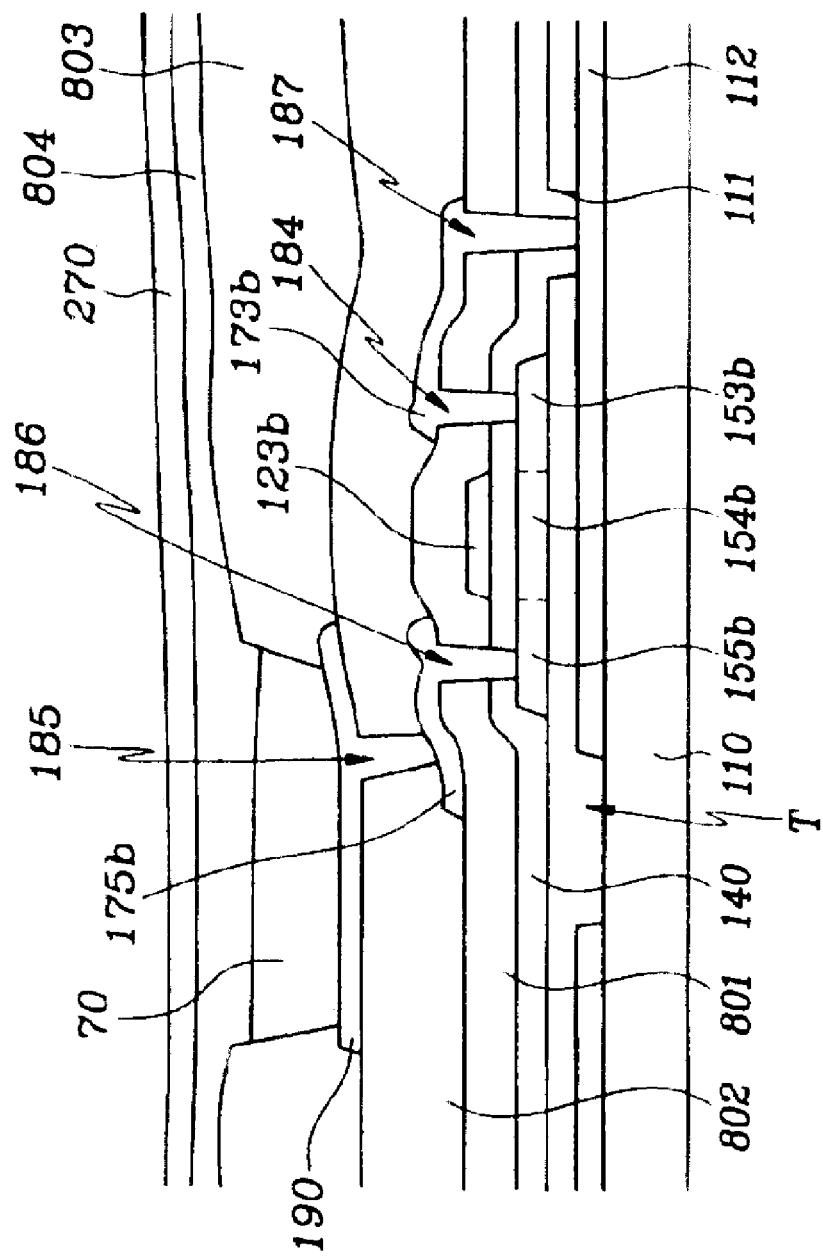
FIG. 15 is another exemplary sectional view of the display panel shown in FIG. 11 taken along the line XIII–XIII'.

FIG. 15 is another exemplary sectional view of the display panel shown in FIG. 11 taken along the lines XIII–XIII'.

Referring to FIG. 15, the blocking layer 111 has a plurality of openings 117 exposing the supply voltage electrode 112 and a plurality of contact holes 187 penetrating the first interlayer insulating film 801 and the gate insulating layer 140 and having smaller size than the openings 117 are formed in the openings 117. The second source electrodes 173b are connected to the supply voltage electrodes 112 through the contact holes 187.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An organic electro-luminescence display panel comprising:
    an insulating substrate;
    a polysilicon layer formed on the substrate;
    a first insulating layer formed on the polysilicon layer;
    a gate wire formed on the first insulating layer;
    a second insulating layer formed on the gate wire;
    a data wire formed on the second insulating layer and including first and second portions;
    a pixel electrode connected to the first portion of the data wire;
    a partition defining an area on the pixel electrode;
    an organic light emitting member formed in the area on the pixel electrode;
    a common electrode formed on the light emitting member; and
    a planar supply voltage electrode disposed between the pixel electrode and the substrate and connected to the second portion of the data wire.

2. The organic electro-luminescence display panel of claim 1, wherein the supply voltage electrode is disposed directly on the substrate.

3. The organic electro-luminescence display panel of claim 1, wherein the partition comprises black photoresist.

4. The organic electro-luminescence display panel of claim 1, wherein the pixel electrode is opaque and the common electrode is transparent.

5. The organic electro-luminescence display panel of claim 1, wherein the pixel electrode is transparent and the common electrode is opaque.

6. The organic electro-luminescence display panel of claim 1, wherein the pixel electrode is transparent and the supply voltage electrode has a transmitting portion facing the light emitting member for transmitting light from the light emitting member.

7. The organic electro-luminescence display panel of claim 1, wherein the supply voltage electrode has an opening facing at least a portion of the polysilicon layer.

8. The organic electro-luminescence display panel of claim 1, further comprising a blocking layer formed on the substrate.

9. The organic electro-luminescence display panel of claim 8, wherein the blocking layer has an opening exposing a portion of the supply voltage electrode, the first and the second insulating layers have a contact hole exposing the exposed portion of the supply voltage electrode through the opening, and the second portion of the data wire is connected to the supply voltage electrode through the opening and the contact hole.

10. The organic electro-luminescence display panel of claim 9, wherein the opening is larger than the contact hole.

11. The organic electro-luminescence display panel of claim 1, wherein the polysilicon layer comprises first and second transistor portions, each including a channel region, a source region, and a drain region, the gate wire comprises first and second gate electrodes overlapping the first and the second transistor portions, respectively, and the data wire comprises a first source electrode connected to the source region of the first transistor portion, a first drain electrode connected to the drain region the first transistor portion and the second gate electrode, a second source electrode connected to the source region of the second transistor portion and the supply voltage electrode, and a second drain electrode connected to the drain region of the second transistor portion and the pixel electrode.

12. The organic electro-luminescence display panel of claim 11, wherein the polysilicon layer further comprises a storage electrode region connected to the source region of the second transistor portion and the gate wire further comprises a storage electrode overlapping the storage electrode region and connected to the second gate electrode.

13. The organic electro-luminescence display panel of claim 12, wherein the pixel electrode is formed of the same layer or the same material as the data wire.

14. The organic electro-luminescence display panel of claim 12, further comprising an auxiliary electrode connected between the supply voltage electrode and the second source electrode.

15. The organic electro-luminescence display panel of claim 14, wherein the auxiliary electrode comprises the same layer as the gate wire.

* * * * *